Figure 1:
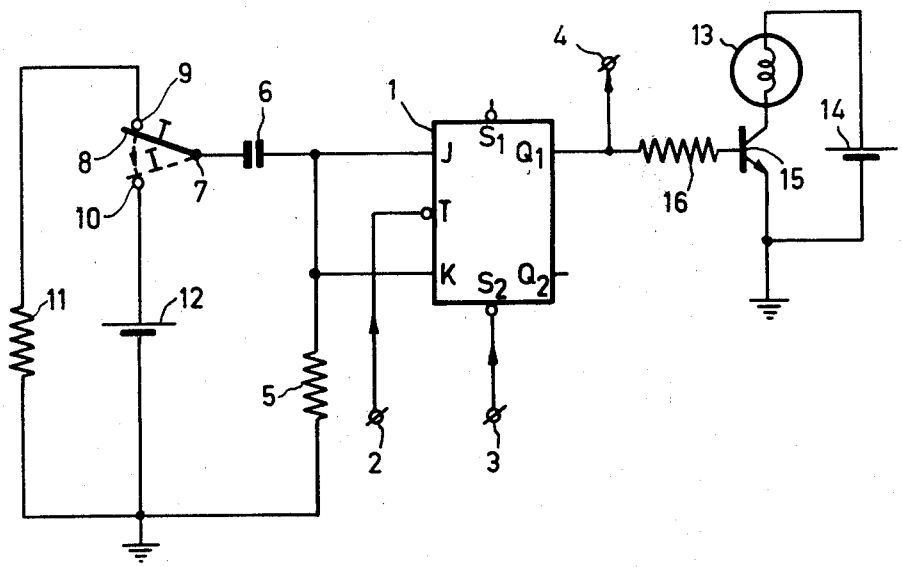

United States Patent [19]

Tiemeijer

[11] 4,074,316
[45] Feb. 14, 1978

[54] ELECTRONIC SWITCHING SIGNAL GENERATOR FOR USE IN TELEVISION

[75] Inventor: Robert Tiemeijer, Eindhoven, Netherlands

[73] Assignee: U.S. Philips Corporation, New York, N.Y.

[21] Appl. No.: 708,600

[22] Filed: July 26, 1976

[30] Foreign Application Priority Data

Apr. 8, 1975 Netherlands ..................... 7509245

[51] Int. Cl.² ........................................... H04N 5/22
[52] U.S. Cl. ................................. 358/181; 307/240
[58] Field of Search ................. 307/239, 240, 247 A, 307/289, 291; 358/182, 183, 181

Primary Examiner—Robert L. Richardson
Attorney, Agent, or Firm—Frank R. Trifari; Henry I. Steckler

[57] ABSTRACT

An electronic switch for use in television which is provided with a master-slave flip-flop which comprises a trigger input for supplying a switching signal which occurs at the field frequency and which has a switching pulse edge which occurs in field blanking times and with a condition input to which a capacitor-charging-discharging circuit is connected which circuit comprises a push-button switch which has one stable state only.

5 Claims, 2 Drawing Figures

ELECTRONIC SWITCHING SIGNAL GENERATOR FOR USE IN TELEVISION

The invention relates to an electronic switching signal generator for use in television provided with a flip-flop which comprises an input for the supply of a switching signal occurring at the field frequency having a switching pulse edge occurring in field blanking times and with a capacitor-charging-discharging circuit which is connected to the flip-flop and which comprises a push-button switch, having one stable state only, a voltage source, a capacitor and charge-discharge resistors.

Such an electronic switching signal generator is described in U.S. Pat. Specification 3,519,739. It is stated that the electronic switching signal generator can be used in, for example, television recording equipment, in particular in camera control-and signal processing equipment, for example for switching over from a picture display device from a camera signal to another camera signal. This switch-over takes place in a field blanking time to prevent a picture interference from being introduced in the display device. It is furthermore stated that the electronic switching signal generator is provided with a plurality of flip-flops, for example three, each comprising two inputs between which mutually interconnected networks of diodes and resistors have been applied. When one of these push-buttons is depressed the associated (first) flip-flop is adjusted to a given, desired state (if it is not in this state already). Thereafter, depressing another push-button adjusts its associated flip-flop to the desired state, whilst the first flip-flop changes back simultaneously to the other state.

It appears that a flip-flop cannot change back to the other state by simply depressing the associated pushbutton for the second time, but that another push-button must be depressed for that purpose. Thus an essential electronic lock is formed between the flip-flops.

It is an object of the invention to realise an electronic switching signal generator which can also be constructed with one flip-flop only so that a lock or an associated push-button switch is not required and a specific diode-resistor network need not be applied but a normal, commercially available module can be used directly.

The electronic switching signal generator according to the invention is therefore characterized in that the flip-flop is constructed as a master-slave flip-flop provided with a trigger input for supplying the switching signal and with at least a condition input which is connected to the capacitor-charging-discharging circuit.

Figure 2:
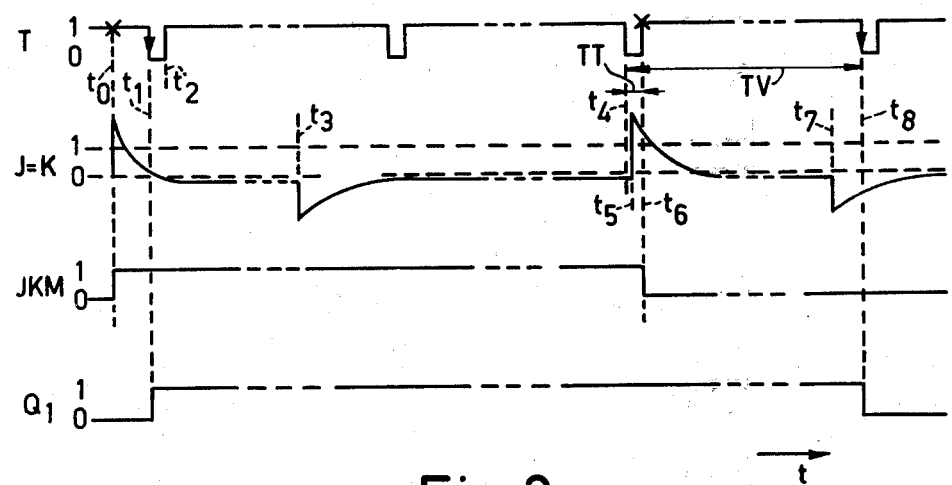

The invention will be further explained with reference to the Figures given as non-limitative example, where FIG. 1 is a circuit diagram of an electronic switching signal generator according to the invention and FIG. 2 shows some signals produced as a function of the time to illustrate the operation of the switch shown in FIG. 1.

The electronic switching signal generator as shown in FIG. 1 is provided with a master-slave flip-flop 1 of JK type and is, for example, of a type 7SN7476. The flip-flop 1 has a trigger input T, two condition inputs J and K, a setting input $S_1$ and a resetting input $S_2$. Furthermore, there are two outputs $Q_1$ and $Q_2$ at which inverse signals are present. It applies to the operation of the master-slave flip-flop 1 that the information at the J- and K inputs are entered into the master (the master has a change in state) when the T input is high, that is to say that in the positive logic a logic 1 is present at the T input, which corresponds to a voltage larger than $+2V$. For entering the information at the J and K inputs it applies that a logic 1 which occurs for a short period at these inputs is retained in the master of the flip-flop 1 by means of the change in state. If thereafter the T input becomes low, that is to say if the logic 0 is present on it, which corresponds to a voltage which is smaller than $+0.8V$ then the information present at the master is passed on to the slave and appears at the outputs $Q_1$ and $Q_2$ (inverted). As the inputs J and K of the flip-flop 1 are interconnected it holds for the flip-flop 1 that when a logic 0 information is present at these inputs no change occurs at the outputs $Q_1$ and $Q_2$, whilst a logic 1 occurring for a shorter or longer period at the J and K inputs results in a change of the state of the master, so that passing on the information from master to slave is accompanied by a change in state of the signal at each of the outputs $Q_1$ and $Q_2$. It applies for the setting input $S_1$ and the resetting input $S_2$ that when a logic 0 is applied to them the signals at the other inputs do not exercise any influence anymore and that the logic 1 or the logic 0 is found at the output $Q_1$.

To operate the master-slave flip-flop 1 the T input is connected to an input terminal 2 for supplying a switching signal which is plotted as signal T in FIG. 2 as a logic 0 and 1 as a function of the time $t$. The logic 1 represents a voltage which exceeds 2V as threshold value and the logic 0 represents a voltage lower than $+0.8$ V as threshold value. The portion TV in the signal T denotes a television field period of a duration of, for example, 20 or 16.6 ms. Switching pulses of short duration having the logic 0 occur in the signal T with a duration TT of, for example, approximately 4.5 $\mu$s. The periods of duration TT are assumed to occur in the field blanking times which occupy approximately 1.5 ms of the field periods TV. From the preceding it follows that a passing on of information can be effected at the flip-flop 1 under the control of the leading edges of the switching pulses of the duration TT whilst a change from the logic 1 to the logic 0 occurs.

The occurrence of the said leading edges which may operate as switching pulse edges in the field blanking periods prevent picture interferences from occurring in the television display.

The resetting input $S_2$ is connected to an input terminal 3 for a possible supply of a blocking signal which contains the logic 0. As a result of internal couplings a logic 1 is present at floating, non-connected inputs $S_1$ and $S_2$. The output $Q_1$ of the flip-flop 1 is connected to an output terminal 4 of the electronic switching signal generator shown in FIG. 1. Camera control and signal processing equipment and video switching equipment may be connected to the output terminal 4 for supplying a switching signal to it. The interconnected inputs J and K of the flip-flop 1 are connected to ground through a resistor 5 and are connected via a capacitor 6 to a fixed contact 7 of a push-button switch 8 which has two further switching contacts 9 and 10. The push-button switch 8 is of a type which has only one stable state (9) that is to say that when no pressure is exerted at, for example, a push-button of the switch 8 the latter invariably connects through the switching contact 9 and the switching contact 10 is only connected through in case pressure is exerted, which consequently results in a non-stable state (10). The switching contact 9 is connected to ground via a resistor 11. The switching contact 10 is connected to a terminal, which carries a positive voltage, of a voltage source 12 another terminal of which is connected to ground. The voltage source 12 supplies, for example, a voltage of +5 V.

Together with the push-button switch 8, the voltage source 12 and the charge-discharge resistors 5 and 11 the capacitor 6 constitutes a capacitor-charging-discharging circuit (5-12) which produces at the inputs J and K of the master-slave flip-flop 1 a signal voltage as shown in FIG. 2 in a signal J = K. At an instant $t_0$ the push-button switch 8 is operated which causes the switching contact 10 to be interconnected and the discharge capacitor 6 to be charged via the resistor 5 by means of a current surge from the voltage source 12. At the instant $t_0$ a voltage peak occurs at the inputs J and K which has a value of +5 V which exceeds the threshold value (+2V) of the logic 1, so that with the logic 1 in the signal T the logic 1 is entered and retained in the master of the flip-flop 1 by means of the change in state of the master which is shown in FIG. 2 by a signal JKM starting from a stable state with the logic 0 on the master and therefore at the $Q_1$ output which has to follow the master. After the insant $t_0$ a voltage drop occurs across the resistor 5 owing to the decrease in current. After some time the capacitor 6 is charged so that in the signal J = K the ground potential is found which is situated below the threshold value (+0.8V) of the logic 0.

In the signal T of FIG. 2 a pulse edge occurs at an instant $t_1$ which goes from the logic 1 to 0 whilst the logic 1 is present in the master of the flip-flop 1 (the signal JKM of FIG. 2). This causes the $Q_1$ (and $Q_2$) output of the flipflop 1 to change state. In FIG. 2 a signal $Q_1$ has been plotted in which, starting from the situation where the logic 0 is found at the $Q_1$ output the logic 1 of the master appears at this output.

At the signal J = K of FIG. 2 an instant $t_3$ is indicated which denotes the moment at which pressure is no longer exercised on the push-button switch 8 of FIG. 1. This causes the push-button switch 8 to change back to the stable state with the interconnected switching contact 9. The capacitor 6 discharges across the resistors 5 and 11 with a current surge as drawn in FIG. 2 at the instant $t_3$ in the signal J = K.

It appears that depressing the push-button switch 8 at the instant $t_0$ causes the signal at the $Q_1$ output of the flip-flop 1 to change state at the instant $t_1$. As an indication for the user of the electronic switching signal generator as shown in FIG. 1 that a switch-over action has been effected, owing to which the video switching equipment connected to the output terminal 4 is switched on an indication circuit having a lamp 13 is connected to the $Q_1$ output. The lamp 13 is included between a terminal of a voltage source 14 and the collector of a npn transistor 15 whose base is connected to the $Q_1$ output of the flip-flop T via a resistor 16. The emitter of the transistor 15 and another terminal of the voltage source 14 are connected to ground. The positive voltage at the $Q_1$ output of the flipflop 1 which corresponds with the logic 1 causes the lamp to light up.

The importance of the use of the capacitor-charging-discharging circuit (5-12) is illustrated by means of FIG. 2. A trailing pulse edge occurs in the signal T of FIG. 2 at an instant $T_4$. It is assumed that at a subsequent instant $t_5$ the push-button switch 8 of FIG. 1 is operated. The fact that the voltage in the signal J = K passes the threshold value associated with the logic 1 now has no consequences for the master in the flip-flop 1 as the logic 0 occurs in the signal T until an instant $t_6$. The occurrence of the logic 1 in the signal T at the instant $t_6$ results in that the logic 1 still present in the signal J = K causes the master of the flip-flop 1 to change state as plotted at the signal JKM. The fact that the push-button switch 8 switches to the stable state (9) at an instant $t_7$ has no consequences for the flip-flop 1. This instant might as well occur earlier or later. In the signal T the next switching pulse edge occurs at an instant $t_8$ so that, as described at the instant $t_1$ when the logic 1 is present in the master the flip-flop 1 changes state i.e. the $Q_1$ output becomes logic 0 as provided by the master. It appears that the charging time constants of the capacitor-charging-discharging circuit (5-12) and the voltage of the voltage source 12 must be chosen such that after the push-button switch 8 has been depressed the logic 1 is still available for a period of time of approximately the pulse duration TT of 4.5 μs. By way of illustration it should be noted that when a capacitor 6 of 22 nF is used and when the charging resistor 5 has a value of 220 Ohm this results in a charging time constant of 4.84 μs which gives for a voltage of +5V for the voltage source 12 and the threshold value of +2V for the logic 1 that the logic 1 occurs for approximately 4.43 μs after the push-button switch 8 has been operated.

The period of time the logic 1 pulse (4.43 μs) is produced shall not exceed the pulse duration TT (4.5 μs) of the switching pulses in the signal T. Otherwise, when pulse edge occurs just before the instant $t_4$ the logic 1 causes the flip-flop 1 to change state at the instant $t_6$ whilst the logic 1 still present after the instant $t_6$ causes a second change of state, that is to say a change back at the instant $t_8$. To prevent this change back the duration of the logic 1 pulse in the signal J = K must be smaller than the pulse duration TT but it should approach it as closely as possible as otherwise when the push-button switch 8 is depressed just after the instant $t_4$ the logic 1 is no longer available at the instant $t_6$ so that pushing the button has no effect.

For completeness it should be noted that the value of the resistor 11 or 16 respectively is, for example, 470 or 4700 ohms respectively, the voltage source 14 has a voltage of +12V and the lamp 13 is a lamp of approximately 0.2 watts.

The input terminal 3 for supplying a blocking signal can be used to prevent that the electronic switching signal generator as shown in FIG. 1 carries, when the push-button switch 8 is operated a switching signal at the output 4 when this is not allowed for some reason or other. This may, for example, be the case in video switching equipment in which there is no synchronisation between two video signals to be mixed, the command for which is given via the switching signal generator according to FIG. 1. This command can only be given when the flip-flop 1 has been released, which is only the case at synchronization by using therefore the blocking signal.

Furthermore a mutual locking can be effected via the input terminal 3 when a plurality of the electronic switching signal generators as shown in FIG. 1 are used. So it is possible with a switching signal having a logic 1 at the output 4 to use the output $Q_2$ of the flip-flop 1 which carries the logic 0 for connection to an input terminal 3' of another electronic switch which causes its flip-flop 1' to be blocked, a logic 0 then being present on the output terminal 4'.

What is claimed is:

1. An electronic switching signal generator comprising a master slave flip-flop circuit including a trigger input means for receiving a switching signal occurring at a television field frequency and having a switching pulse edge occurring during field blanking intervals, and at least one condition input means; and a capacitor charging and discharging circuit coupled to said condition input means and including a monostable push-button switch, a voltage source coupled to said switch, a capacitor coupled to said switch and a pair of charge-discharge resistors coupled to said switch and said capacitor respectively.

2. An electronic switching signal generator as claimed in claim 1, wherein the switching signal occurring at the field frequency has switching pulses of a duration which just exceeds the duration of occurrence of a pulse having values which have passed a threshold value and which are supplied to the condition input of the flip-flop by the capacitor-charging-discharging circuit.

3. An electronic switching signal generator as claimed in claim 1, wherein the master-slave flip-flop comprises a JK type, having J and K condition inputs comprising said condition input means and being interconnected and coupled to the capacitor-charging-discharging circuit.

4. An electronic switching signal generator in claim 1, wherein the pushbutton switch has a switch contact associated with the stable state coupled to one of said resistors, a switching contact associated with the non-stable state coupled to said voltage source, and a fixed contact coupled to the capacitor, said resistors and source being coupled to ground.

5. An electronic switching signal generator as claimed in claim 1, further comprising an indicator circuit coupled to a flip-flop output and which comprises a lamp.

* * * * *